(12) United States Patent
Ushakov et al.

(10) Patent No.: US 7,804,250 B2
(45) Date of Patent: Sep. 28, 2010

(54) APPARATUS AND METHOD TO GENERATE PLASMA

(75) Inventors: Andrey Ushakov, Suwon-si (KR); Yuri Tolmachev, Suwon-si (KR); Vladimir Volynets, Suwon-si (KR); Won Ceak Pak, Seoul (KR); Vasily Pashkovskiy, Yongin-si (KR); Sung Chang Park, Seoul (KR); Yung Hee Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 823 days.

(21) Appl. No.: 11/684,199

(22) Filed: Mar. 9, 2007

(65) Prior Publication Data
US 2008/0061702 A1    Mar. 13, 2008

(30) Foreign Application Priority Data
Sep. 8, 2006   (KR) ...................... 10-2006-0087064

(51) Int. Cl.
*H05B 6/00*   (2006.01)
(52) U.S. Cl. ............................ 315/111.21; 315/111.31; 315/111.71
(58) Field of Classification Search ........................ 315/111.21–111.91; 156/345.31
See application file for complete search history.

(56) References Cited

U.S. PATENT DOCUMENTS

2007/0074814 A1*   4/2007   Hahn et al. ............. 156/345.31

FOREIGN PATENT DOCUMENTS

| JP | 07-130497 | 5/1995 |
|---|---|---|
| KR | 10-274307 | 5/1996 |
| KR | 2006-24690 | 3/2006 |

OTHER PUBLICATIONS

Japanese Office Action issued May 7, 2010 in JP Application No. 2007-103928.

* cited by examiner

*Primary Examiner*—David Hung Vu
(74) *Attorney, Agent, or Firm*—Stanzione & Kim LLP (57) ABSTRACT

An apparatus and method to generate plasma which can be applied to semiconductor processing. The apparatus includes a chamber having a plasma generating space defined therein, a lower electrode positioned within the chamber, an upper electrode facing the lower electrode and disposed within the chamber to constitute a first plasma generating source, a second plasma generating source positioned at a higher location than that of a lower surface of the upper electrode and disposed at an outer circumference of the upper electrode, and a power supply to supply power to the first and second plasma generating sources.

36 Claims, 5 Drawing Sheets

APPARATUS AND METHOD TO GENERATE PLASMA

CROSS-REFERENCE TO RELATED APPLICATIONS

This application claims priority under 35 U.S.C. §119(a) from Korean Patent Application No. 2006-0087064, filed on Sep. 24, 2006 in the Korean Intellectual Property Office, the disclosure of which is incorporated herein in its entirety by reference.

BACKGROUND OF THE INVENTION

1. Field of the Invention

The present general inventive concept relates to a semiconductor manufacturing apparatus, and more particularly, to an apparatus and method to generate plasma which can be applied to semiconductor processing.

2. Description of the Related Art

An etching process is a type of semiconductor manufacturing process which selectively removes some portions of a semiconductor layer under a patterned photosensitive film on a semiconductor substrate. The etching process can be generally classified into a dry etching process and a wet etching process. Recently, a plasma-based dry etching process has been developed to form fine semiconductor patterns having a size of microns or less in response to a high integration of a semiconductor device.

For the plasma-based dry etching process, with a reaction gas introduced into an air-tight chamber and then ionized into plasma, the plasma-based dry etching process is performed along patterns on a semiconductor substrate via an acceleration force and a chemical reaction of plasma ions.

One of the most general plasma generating apparatuses is an RF plasma generating apparatus which converts a reaction gas introduced into a chamber to plasma via an RF electric field generated when applying a high frequency power to electrodes positioned inside the chamber.

RF plasma generating apparatuses can be classified into a capacitively coupled plasma (CCP) generating apparatus, which generates plasma using characteristics of a capacitor formed between an upper and a lower planar electrode facing each other, and an inductively coupled plasma (ICP) generating apparatus, which generates plasma using characteristics of an inductor formed by an upper coil opposite a lower planar electrode.

The CCP generating apparatus has an advantage in that it has a higher etching selection ratio with respect to a photosensitive film than that of the ICP generating apparatus. However, the CCP generating apparatus has a disadvantage in that an electric discharge occurs only when a chamber pressure reaches a predetermined pressure of about 20~50 mTorr or more, providing disadvantageous effects to an etching profile, and a disadvantage in that the plasma generated by the CCP generating apparatus has low density, thereby deteriorating an etching rate.

On the other hand, the ICP generating apparatus has an advantage in that, since the ICP generating apparatus can generate plasma at low pressures (1~5 mTorr), it can more easily form micro patterns than the CCP generating apparatus, and an advantage in that since the plasma generated by the ICP generating apparatus has high density, it has a high etching rate. However, the ICP generating apparatus has a disadvantage of a low etching selection ratio due to a high temperature of electrons of the plasma generated by the ICP generating apparatus.

Accordingly, a new type of RF plasma generating apparatus has been recently developed, which combines the CCP apparatus and the ICP apparatus so as to compensate for the contradictory advantages and disadvantages of both apparatuses. Details of this RF capacitively and inductively coupled plasma generating apparatus are disclosed in U.S. Pat. No. 6,308,654.

The RF capacitively and inductively coupled plasma generating apparatus described in U.S. Pat. No. 6,308,654 includes a conical induction current coil positioned on an outer wall of an air-tight chamber so as to surround a plasma generating space defined between electrodes for the purpose of compensating for the disadvantage of the electrode discharge in the CCP apparatus, such that additional plasma is generated in the chamber by an electric field generated when applying a high frequency power to the conical induction current coil, thereby allowing high density plasma to be generated at low pressures.

The capacitively and inductively coupled plasma generating apparatus has an advantage of increasing the etching rate through an increase in plasma density within the chamber, but has a disadvantage in that, since the electric discharge by the induction current coil is generated in the plasma generating region, the etching selection ratio decreases due to a high electron temperature.

For an advanced semiconductor device, etching of an integrated circuit must be performed to have a narrow width and a high depth so as to form vias and contacts which have an aspect ratio of 5:1 or more. Thus, the reduction in the etching selection ratio causes the disadvantage of decreasing an etching efficiency as described above.

SUMMARY OF THE INVENTION

The present general inventive concept provides an apparatus to generate plasma which can be applied to a plasma etching process to form patterns on a semiconductor substrate operated at low pressures of about 0.3~10 mTorr, and that can generate high density plasma having a high etching rate and a high etching selection ratio.

The present general inventive concept also provides an apparatus to generate plasma which can uniformly distribute plasma over a target semiconductor substrate in a plasma generating space.

Additional aspects and/or advantages of the present general inventive concept will be set forth in part in the description which follows and, in part, will be obvious from the description, or may be learned by practice of the general inventive concept.

The foregoing and/or other aspects and utilities of the present general inventive concept are achieved by providing an apparatus to generate plasma, including a chamber having a plasma generating space defined therein, the apparatus further including a lower electrode positioned within the chamber and having a table to support a semiconductor substrate, an upper electrode facing the lower electrode and disposed within the chamber to constitute a first plasma generating source together with the lower electrode, a second plasma generating source positioned at a higher location than that of a lower surface of the upper electrode and disposed at an outer circumference of the upper electrode, and a power supply to supply power to the first and second plasma generating sources.

The second plasma generating source may include a planar dielectric plate connected to the outer circumference of the upper electrode to constitute an upper surface of the chamber together with the upper electrode, and a coil electrode mounted on an upper surface of the dielectric plate.

The coil electrode may have a planar helical shape surrounding the outer circumference of the upper electrode.

The second plasma generating source may further include a magnetic substance positioned to surround the coil electrode.

The power supply may include a first RF power supply to provide an RF power to the first plasma generating source, and a second RF power supply to supply an RF power to the second plasma generating source.

The RF power supplied to the first plasma generating source may have a higher frequency than the RF power supplied to the second plasma generating source.

The upper electrode may include a plurality of apertures through which a reaction gas is introduced into the chamber.

The chamber may have a cylindrical shape, and have an inner pressure of 0.3~10 mTorr.

The foregoing and/or other aspects and utilities of the present general inventive concept are also achieved by providing an apparatus to generate plasma including a chamber having a plasma generating space defined therein, the apparatus further including a lower electrode positioned within the chamber and having a table to support a semiconductor substrate, an upper electrode facing the lower electrode and disposed within the chamber to constitute a first plasma generating source together with the lower electrode, a second plasma generating source positioned at a higher location than that of a lower surface of the upper electrode and disposed at an outer circumference of the upper electrode, the second plasma generating source including a dome-shaped dielectric plate connected to the outer circumference of the upper electrode to constitute an upper surface of the chamber together with the upper electrode, and a coil electrode mounted on an upper surface of the dielectric plate, and a power supply to supply power to the first and second plasma generating sources.

The coil electrode may have a conical shape configured to surround the outer circumference of the upper electrode, and gradually decreases in height with respect to the lower surface of the upper electrode as a turning radius of the coil electrode increases.

A distance between an outermost section of the coil electrode and the table disposed on the lower electrode may be greater than a distance between the upper electrode and the table of the lower electrode.

The second plasma generating source may further include a magnetic substance positioned to concentrate a magnetic field generated by the coil electrode below the coil electrode.

The power supply may be provided separately for each of the first and second plasma generating sources to supply RF power thereto.

The RF power supplied to the first plasma generating source may have a higher frequency than the RF power supplied to the second plasma generating source.

The upper electrode may include a plurality of apertures through which a reaction gas is introduced into the chamber.

The chamber may have a cylindrical shape, and have an inner pressure of 0.3~10 mTorr.

The foregoing and/or other aspects and utilities of the present general inventive concept are also achieved by providing an apparatus to generate plasma, the apparatus including a first chamber including a lower electrode positioned within the chamber and having a table to support a semiconductor substrate disposed thereon, and an upper electrode facing the lower electrode and disposed within the chamber to constitute a first plasma generating source together with the lower electrode, a second chamber having a predetermined height, and being positioned on an upper surface of the first chamber so as to surround an outer circumference of the upper electrode, an opening formed through the upper surface of the first chamber and a lower surface of the second chamber to communicate the first chamber with the second chamber, a second plasma generating source positioned on an upper surface of the second chamber, and a power supply to supply power to the first and second plasma generating sources.

An inner and outer wall of the second chamber and the upper surface of the second chamber may be formed from a dielectric material, and the second plasma generating source may include a coil electrode mounted on the upper surface of the second chamber.

The second plasma generating source may further include a magnetic substance positioned to surround the coil electrode.

A distance between the second plasma generating source and the table of the lower electrode may be greater than a distance between the upper electrode and the table of the lower electrode.

The second chamber may be positioned such that an edge of the semiconductor substrate mounted on the table disposed on the lower electrode faces the opening of the second chamber.

The second chamber may further include a rare gas supply unit to supply a rare gas thereinto.

The power supplied to the first plasma generating source may have a higher frequency than the power supplied to the second plasma generating source.

The upper electrode may include a plurality of apertures through which a reaction gas is introduced into the chamber.

The chamber may have a cylindrical shape, and have an inner pressure of 0.3~10 mTorr.

The foregoing and/or other aspects and utilities of the present general inventive concept are also achieved by providing a method of generating plasma, including primarily generating plasma through a first plasma generating source positioned at a higher location than that of a first plasma generating source, and disposed at an outer circumference of a second plasma generating source, and secondarily generating plasma through the second plasma generating source once a predetermined period of time has elapsed after the plasma is primarily generated.

The first plasma generating source may include an inductively coupled plasma generating source, the second plasma generating source may include a capacitively coupled plasma generating source, and a plasma generating region may have an inner pressure of 0.3~10 mTorr.

A plasma density may be controlled by adjusting an intensity of an RF power supplied to the second plasma generating source.

The foregoing and/or other aspects and utilities of the present general inventive concept are also achieved by providing a plasma generating apparatus, including a first chamber defining a reaction space therein, a first plasma generating source including a lower and an upper electrode disposed within the first chamber and position to face each other and defining a first plasma generation region therebetween, a second plasma generating source including a coil electrode and disposed at an outer circumference of the upper electrode and defining a second plasma generating region at a predetermined distance from reaction space, and a plurality of power sources to supply an RF power to the first and second plasma generating sources, wherein electrons of the plasma generated in the second plasma generating region diffuse the predetermined distance to the reaction space having a lower electron temperature.

The second plasma generating source may include a second chamber defining the second plasma generation region disposed at an upper surface of the first chamber, wherein the coil electrode is disposed at an upper surface thereof, and an opening to communicate the first chamber and the second chamber to diffuse plasma generated in the second plasma generation region to the first generation region.

The foregoing and/or other aspects and utilities of the present general inventive concept are also achieved by providing a plasma generating apparatus, including a chamber including first and second electrodes facing each other and disposed therein to generate a plasma from a gas dispersed therein by supplying a first RF power, the first electrode being disposed above the second electrode, and an outer plasma generating source disposed on an outer surface of the chamber to surround an outer circumference of the first electrode and positioned above a lower surface of the first electrode to generate a plasma by supplying a second RF power having a lower frequency that the first RF power supplied.

The outer plasma generating source may include a coil electrode.

The outer plasma generating source may further include a dielectric plate to contain the coil electrode thereon.

The outer plasma generating source may further include a magnetic substance to surround upper and side surfaces of the coil electrode and having a high permeability.

The dielectric plate may be formed in the shape of a dome.

The apparatus may further include a second chamber surrounding an outer circumference of the first chamber and having the outer plasma generating source disposed thereon to generate a plasma within the second chamber.

BRIEF DESCRIPTION OF THE DRAWINGS

These and/or other aspects and advantages of the general inventive concept will become apparent and more readily appreciated from the following description of the embodiments, taken in conjunction with the accompanying drawings, of which.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements. The embodiments are described below in order to explain the present general inventive concept by referring to the figures.

Figure 1:
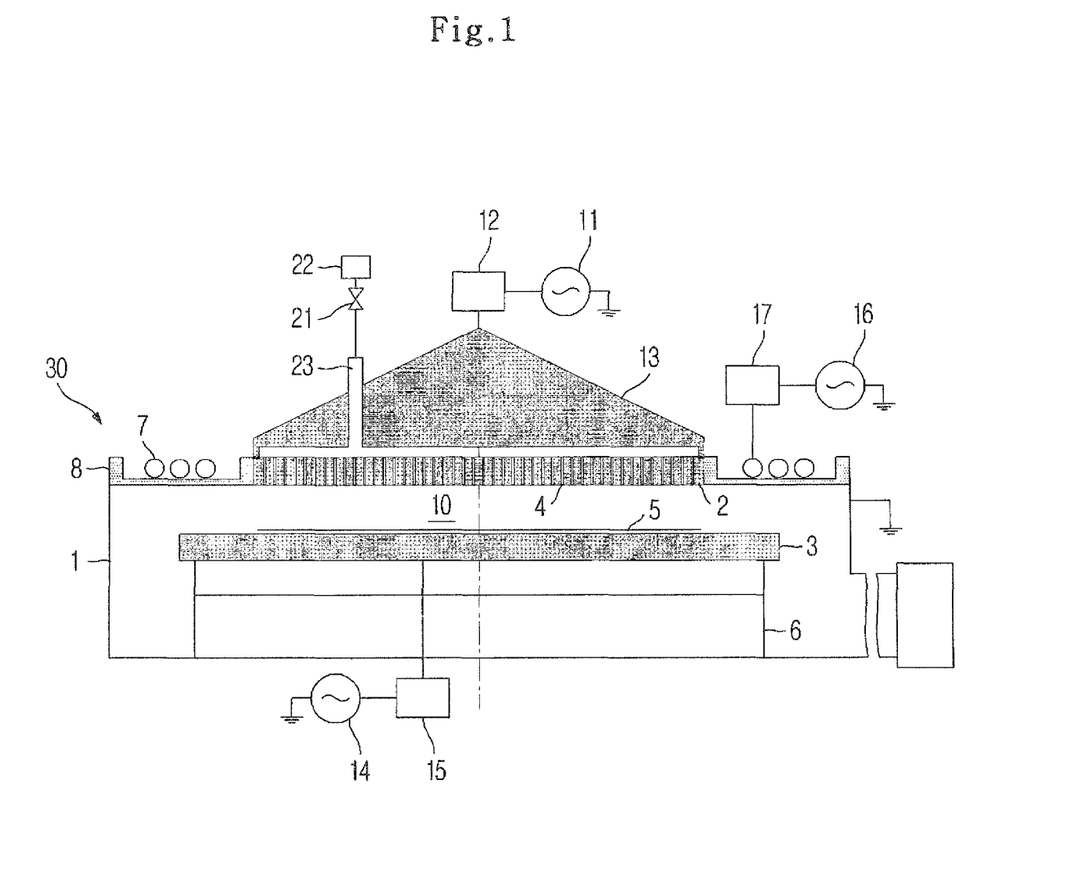
FIG. 1 is a cross-sectional view illustrating a plasma generating apparatus according to an embodiment of the present general inventive concept.

FIG. 1 is a cross-sectional view illustrating a plasma generating apparatus according to an embodiment of the present general inventive concept.

Referring to FIG. 1, the plasma generating apparatus according to this embodiment may include a chamber 1 having a plasma generating space defined therein, a lower electrode 3 positioned within a lower portion of the chamber 1, an upper electrode 2 facing the lower electrode 3 within the chamber 1 to form a capacitively coupled plasma generating source along with the lower electrode 3, and an inductively coupled plasma generating source 30 positioned at an outer circumference of the upper electrode 2 and connected to the circumference of the upper electrode 2 to form an upper surface of the chamber 1 along with the upper electrode 2.

While in the exemplary embodiment illustrated in FIG. 1 the chamber 1 has a cylindrical shape, the present general inventive concept is not limited thereto, and the chamber 1 may alternatively have other shapes. The chamber 1 is operated at a low inner pressure of about 0.3~10 mTorr to allow micro patterns to be easily formed during an etching process.

The upper electrode 2 may include a plurality of gas injection apertures 4 which are connected to a gas valve 21 and a gas source 22 via a gas duct 23 to introduce a reaction gas supplied via operation of the gas valve 21 into the chamber 1. For example, $C_6F_6$ or $C_4F_8$ can be used as the reaction gas for the etching process.

With the plurality of gas injection apertures 4, the reaction gas can be uniformly dispersed in a main plasma generating space 10 so that a plasma distribution becomes uniform in the chamber 1, thereby allowing the etching process to be uniformly performed on an overall surface of a semiconductor substrate 5.

The upper electrode 2 is connected to a first RF power supply 11 via a first matching system 12 and a high frequency (hereinafter RF) power guide system 13 to generate plasma through an electric discharge based on characteristics of a capacitor formed between the upper and lower electrodes when an RF power is supplied thereto. For example, the upper electrode 2 can be supplied with an RF power of about 500~2,000 W with a frequency of about 100~200 MHz.

The lower electrode 3 may be positioned on a susceptor 6, which may include various systems to adjust a distance between the lower electrode 3 and the upper electrode 2 and/or to heat, cool, and to secure the semiconductor substrate 5.

The lower electrode 3 may have an upper surface configured to mount the semiconductor substrate 5 thereon. Alternatively, a table (not illustrated) may be disposed on the lower electrode 3 to support the semiconductor substrate 5 thereon. The lower electrode 3 may be maintained at a ground potential. Alternatively, the lower electrode 3 may be connected to a bias power supply 14 via a second matching system 15, and biased thereby. For example, the lower electrode 3 can be supplied with a bias RF power of about 2,000 W with a frequency of about 13 MHz.

The inductively coupled plasma generating source 30 may include a planar dielectric plate 8 connected to the outer circumference of the upper electrode 2 to form the upper surface of the chamber 1, and a coil electrode 7 mounted on an upper surface of the dielectric plate 8 and wound around the outer circumference of the upper electrode 2.

The coil electrode 7 may include one or more turning sections, the innermost of which may have a greater turning diameter than that of the outer circumference of the upper electrode 2. In addition, the upper surface of the dielectric plate 8 on which the coil electrode 7 is mounted may be higher than a lower surface of the upper electrode 2 so that a distance between the coil electrode 7 and the lower electrode 3 is greater than a distance between the upper electrode 2 and the lower electrode 3.

The coil electrode 7 may be turned in a variety of manners including a ring shape and a helical shape, both of which are known in the art.

The coil electrode 7 may be supplied with RF power independent of the upper electrode 2 by a second RF power supply 16 via a third matching system 17. Generally, the RF power supplied to the coil electrode 7 has a lower frequency than that of the upper electrode 2. For example, the coil electrode 7 may be supplied with an RF power of about 500~1,000 W at a frequency of about 2 MHz. In addition, plasma density can be maintained at a desired level by increasing the RF power supplied to the coil electrode 7.

When the RF power is supplied to the coil electrode 7, an electric discharge occurs in a region of the chamber 1 under the lower surface of the dielectric plate 8, thereby generating plasma.

Since the chamber 1 is operated at low pressures, the electric discharge through the upper electrode 2 does not occur at an initial stage. Thus, a primary plasma generation or ignition commences through the electric discharge of the coil electrode 7 to generate plasma at a predetermined initial plasma density in the main plasma generating space 10 into which the reaction gas is injected, and then a secondary plasma generation or ignition is induced through the electric discharge of the upper electrode 2, generating a high density plasma through the two plasma generating sources.

In this regard, since the coil electrode 7 may be positioned at a higher location than that of the lower surface of the upper electrode 2, disposed at the outer circumference of the upper electrode 2, and separated a predetermined distance from the main plasma generating space 10 constituted by the upper and lower electrodes 2 and 3, a temperature of electrons in the plasma is lowered, thereby providing a high etching selection ratio.

When the electric discharge occurs in the region of the chamber 1 near a lower portion of the coil electrode 7, a possibility of collision between particles in the plasma increases during a diffusion of the electrons from the region near the lower portion of the coil electrode 7 to the main plasma generating space 10 due to a long distance between a location where the electric discharge occurs and the main plasma generating space 10, so that the diffusing electrons lose their energy, thereby lowering their temperature.

In addition, since the coil electrode 7 is placed along an outer periphery of the chamber 1, it is possible to overcome a problem of a reduction in plasma density at an edge of the plasma generating space 10 compared with a center thereof so that the plasma density becomes uniform on the overall surface of the semiconductor substrate 5.

Additionally, since the coil electrode 7 may be positioned higher than the lower surface of the upper electrode 2, it is possible to prevent an increase in a distance between the upper electrode 2 and the lower electrode 3 when winding the coil around the chamber 1.

Accordingly, a volume of a reaction space in the chamber 1 is reduced so that a residence time from an initial injection of the reaction gas into the reaction space to an escape of the reaction gas from a processing region on the semiconductor substrate 5 is shortened, thereby providing the high etching selection ratio.

In this present embodiment, a distance between the upper and lower electrodes 2 and 3 is noticeably smaller than a diameter of the semiconductor substrate 5. For example, the distance between the upper and lower electrodes 2 and 3 may be maintained at between about 20~40 mm.

Figure 2:
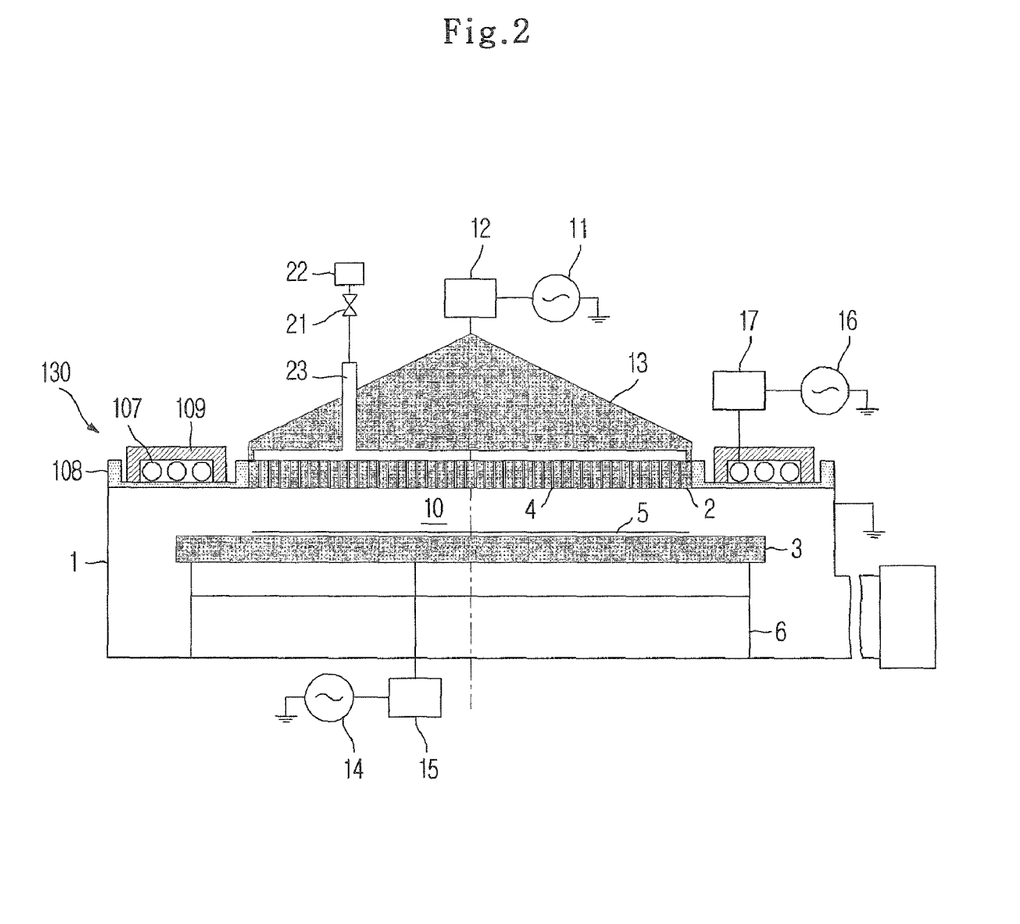
FIG. 2 is a cross-sectional view illustrating a plasma generating apparatus according to another embodiment of the present general inventive concept.

FIG. 2 is a cross-sectional view illustrating a plasma generating apparatus according to another embodiment of the general inventive concept. Components of this embodiment that are similar to those of the embodiment illustrated in FIG. 1 are denoted by the same reference numerals, and thus, description thereof is omitted hereinafter.

In the plasma generating apparatus according to this present embodiment an inductively coupled plasma generating source 130 may include a coil electrode 107, a dielectric plate 108, and a magnetic substance 109 that surrounds the upper and side portions of the coil electrode 107 and has high permeability.

The magnetic substance 109 serves to force a magnetic flux from the coil electrode 107 and to concentrate the magnetic flux on a region directly under the coil electrode 109, preventing energy of the coil electrode 107 from being lost to an unnecessary region, such as to a side of the chamber 1, and generating a high density plasma in a necessary region, such as a main plasma generating space 10.

Figure 3:
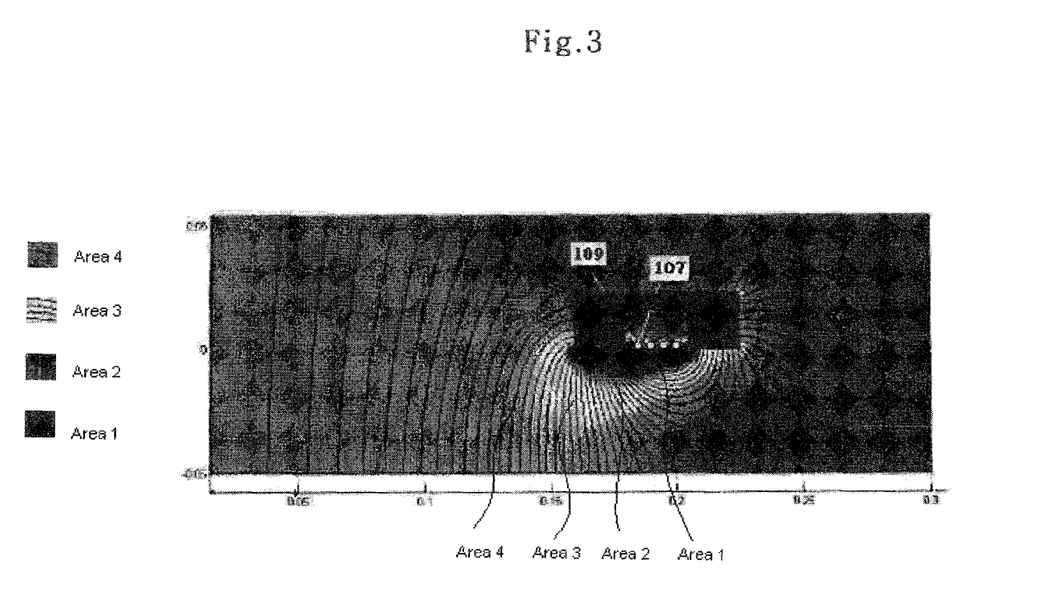
FIG. 3 is a diagram illustrating a result of a simulation of an effect of a magnetic substance in the plasma generating apparatus of FIG. 2.

In FIG. 3, a result of a simulation of an effect of the magnetic substance 109 in the plasma generating apparatus of FIG. 2 is illustrated with different shades according to an intensity of a magnetic field. In FIG. 3, area 1 indicates a region of a highest intensity of the magnetic field, area 2 indicates a region of a second highest intensity of the magnetic field, area 3 indicates a region of a third highest intensity of the magnetic field, and area 4 indicate a region of a fourth highest intensity of the magnetic field. As illustrated in FIG. 3, the intensities of the magnetic field sequentially decrease, and it can be understood that the magnetic field is concentrated on a region near the coil electrode 107.

A method of operating the plasma generating apparatus of the present embodiment is similar to that of the embodiment illustrated in FIG. 1.

Figure 4:
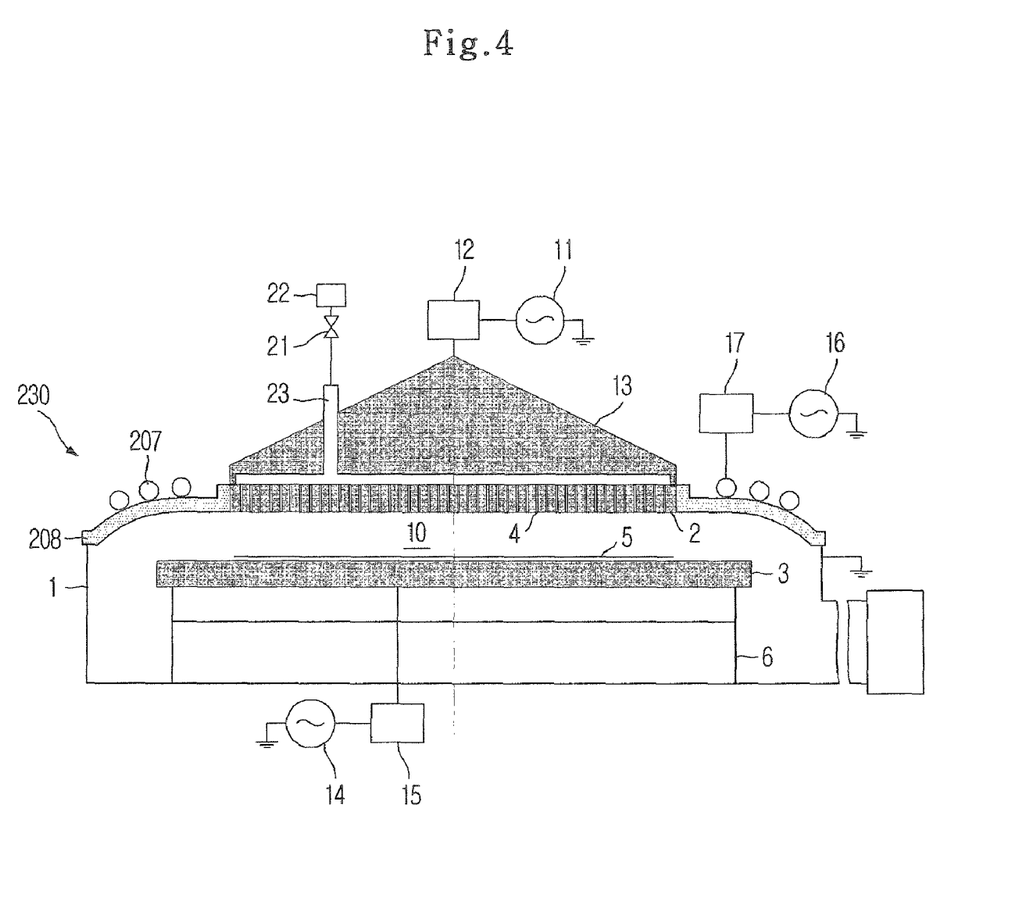
FIG. 4 is a cross-sectional view illustrating a plasma generating apparatus according to yet another embodiment of the present general inventive concept.

FIG. 4 is a cross-sectional view illustrating a plasma generating apparatus according to yet another embodiment of the general inventive concept. Components of the present embodiment that are similar to those of the embodiment illustrated in FIG. 1 are denoted by the same reference numerals, and thus, description thereof will be omitted hereinafter.

In the plasma generating apparatus of this embodiment an inductively coupled plasma generating source 230 may include a dome shaped dielectric plate 208 and a coil electrode 207 mounted on an upper surface of the dielectric plate 208.

The coil electrode 207 may include three turning sections having different heights with respect to a lower surface of an upper electrode 2, and is configured to surround an outer circumference of the upper electrode 2. While in the present embodiment the coil electrode 207 may include three turning sections, the present general inventive concept is not limited thereto, and the coil electrode 207 may have a different number of turns of the coil electrode 207. Similarly, while the embodiment of FIG. 4 illustrates a domed-shape dielectric plate 208, the present general inventive concept is not limited thereto, and the dielectric plate can have other shapes to dispose turning sections of the coil electrode 207 at different heights with respect to the lower surface of the upper electrode 2.

Since turning sections of the coil electrode 207 reduce in height with an increase in a turning diameter of the coil electrode 207, a distance between a lower electrode 3 and an outermost turning section of the coil electrode 207 is shorter than the distance between the lower electrode 3 and an innermost turning section of the coil electrode 207. The distance between the lower electrode 3 and the outermost turning section of the coil electrode 207 may also be shorter than a distance between the lower electrode 3 and the coil electrode 7 of the embodiment illustrated in FIG. 1. Thus, the plasma generating apparatus of this embodiment can more easily solve a problem of a reduction in plasma density in a region facing an edge of a semiconductor substrate 5. Even when the coil electrode 207 is conically wound around the dome shaped dielectric plate 208, the distance between the upper and lower electrodes 2 and 3 must not increase, and the distance between the coil electrode 207 and the main plasma generating space 10 must not decrease.

A method of operating the plasma generating apparatus of this present embodiment is also similar to that of the embodiment illustrated in FIG. 1.

Figure 5:
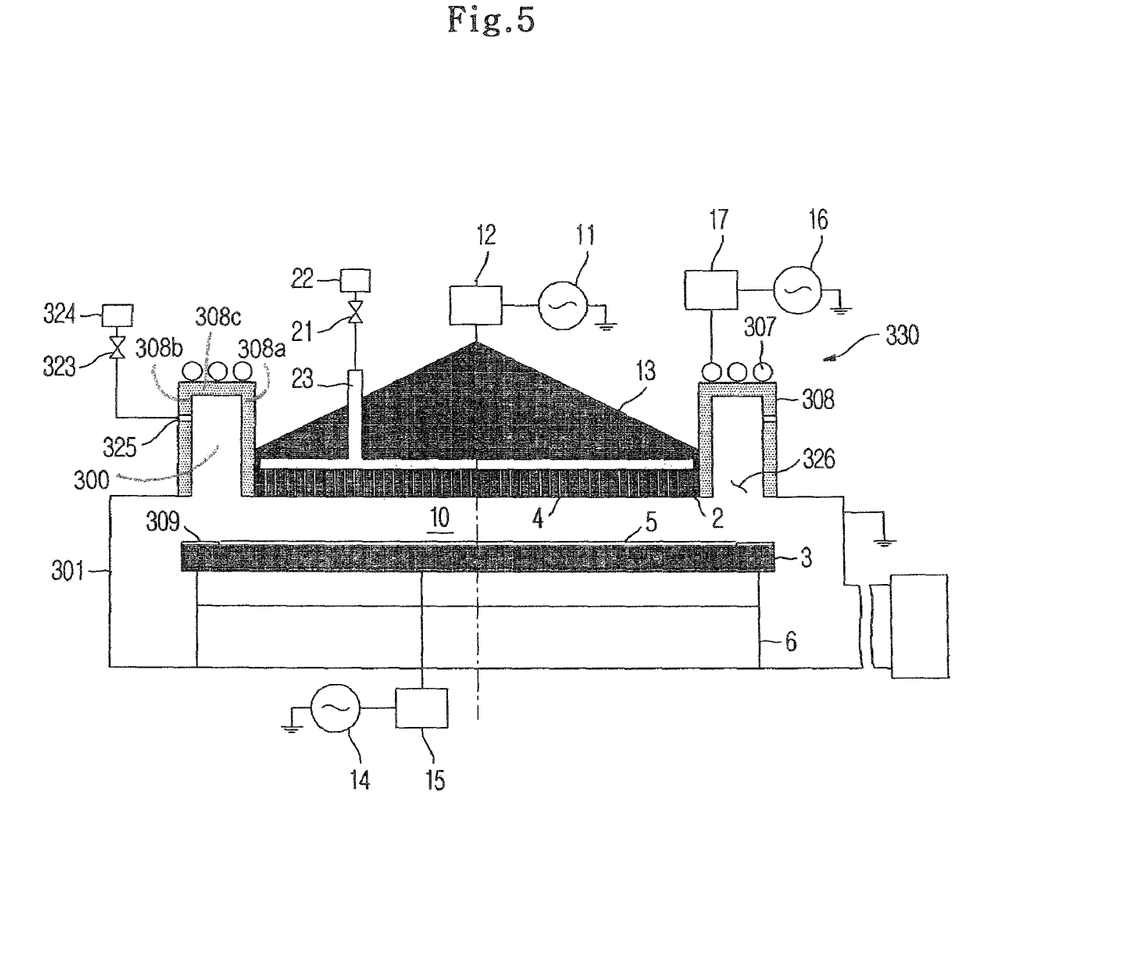
FIG. 5 is a cross-sectional view illustrating the plasma generating apparatus according to yet another embodiment of the present general inventive concept.

FIG. 5 is a cross-sectional view illustrating a plasma generating apparatus according to yet another embodiment of the general inventive concept. Components of this present embodiment that are similar to those of the embodiment illustrated in FIG. 1 are denoted by the same reference numerals, and thus, description thereof will be omitted hereinafter.

The plasma generating apparatus of this embodiment may include a first chamber 301 which includes a capacitively coupled plasma generating source constituted by upper and lower electrodes 2 and 3 facing each other, a second chamber 308 which has a predetermined height and is positioned on an upper surface of the first chamber 301 while surrounding an outer circumference of the upper electrode 2, and an opening 326 formed between the first and second chambers 301 and 308 to communicate the first chamber 301 with the second chamber 308.

The second chamber 308 may include an inner wall 308*a*, an outer wall 308*b*, and an upper surface 308*c* constituted by dielectric plates, defining a second plasma generation space 300 therein, and a coil electrode 307 mounted on the upper surface 308*c* thereof to form an inductively coupled plasma generating source 330, such that, when an RF power is applied to the coil electrode 307, an electric discharge occurs in the second plasma generation space 300 having a predetermined height. The second chamber 308 may define a ring-shaped second plasma generation space 300 disposed at an outer circumference of the upper electrode 3.

Since the ring-shaped inner plasma generation space 300 of the second chamber 308, where the discharge occurs, is positioned at a distance from a main plasma generating space 10 within the first chamber 301, the temperature of electrons of plasma generated in the second chamber 308 is lowered as it diffuses into the main plasma generating space 10, thereby providing a high etching selection ratio.

When the electric discharge occurs in a region of the chamber 308 near a lower portion of the coil electrode 307, electrons, which are lighter than ions, move at a higher velocity toward the first chamber 301 through the opening 326, so that a positive voltage is created in an instant in the region where the electric discharge occurs.

Thus, the electrons generated thereafter lose their energy due to a collision between particles occurring while they move toward the main plasma generating space 10 of the first chamber 301 after surmounting an electrical attraction by the positive voltage, and finally reach the main plasma generating space 10 with a lowered electron temperature, thereby providing the high etching selection ratio.

A shielding ring 309 may be positioned on an edge of the lower electrode 3 to face the opening 326 of the second chamber 308, thereby preventing energy loss of electrons, and an inner diameter of the inner wall of the second chamber 308 may be dimensioned smaller than the diameter of the semiconductor substrate 5 to allow an edge of the semiconductor substrate 5 to face the opening 326 of the second chamber 308, thereby preventing the plasma density from being reduced on the edge of the semiconductor substrate 5.

In another method of enhancing the etching selection ratio according to the present embodiment of the general inventive concept, a rare gas, such as argon, may be separately introduced into the second chamber 308. In this method, argon ions, argon particles, and excited argon particles generated according to a colliding state between argon and electrically discharged electrons in the second chamber 308 diffuse into the first chamber 301, and reduce a residence time of the reaction gas introduced from gas injection apertures 4 of the upper electrode 2 by diluting the reaction gas, thereby enhancing the etching selection ratio.

FIG. 5 illustrates an exemplary embodiment of the second chamber 308 which may include a rare gas injection hole formed on the outer wall 308*b* of the second chamber 308. The rare gas injection hole 325 is connected to a rare gas valve 323 and a rare gas storage unit 324, and serves to introduce the rare gas into the second chamber therethrough by operation of the rare gas valve 323. Alternatively, the rare gas injection hole 325 may be formed on the upper surface 308*c* of the second chamber 308, or at the inner wall 308*a* of the second chamber 308.

A method of operating the plasma generating apparatus of this embodiment is similar to that of the embodiment illustrated in FIG. 1. While in the present embodiment, illustrated in FIG. 5, the first chamber has a cylindrical shape and second chambers is ring-shaped the present general inventive concept is not limited thereto, and the first and second chambers may have other configurations.

A plasma generating apparatus according to the present general inventive concept may include an inductively coupled plasma generating source positioned at a predetermined distance from a main plasma generating space constituted by a capacitively coupled plasma generating source so that electrons having high temperatures are supplied with a reduced electron temperature to the main plasma generating space, thereby generating high density plasma at a lower pressure while providing a high etching selection ratio.

Although a few embodiments of the present general inventive concept have been shown and described, it will be appreciated by those skilled in the art that various changes may be made in these embodiments without departing from the principles and spirit of the general inventive concept, the scope of which is defined in the appended claims and their equivalents.

What is claimed is:

1. An apparatus to generate plasma, comprising a chamber having a plasma generating space defined therein, the apparatus further comprising:
   a lower electrode positioned within the chamber and having a table to support a semiconductor substrate;
   an upper electrode facing the lower electrode and disposed within the chamber to constitute a first plasma generating source together with the lower electrode;
   a second plasma generating source positioned at a higher location than that of a lower surface of the upper electrode and disposed at an outer circumference of the upper electrode; and
   a power supply to supply power to the first and second plasma generating sources.

2. The apparatus according to claim 1, wherein the second plasma generating source comprises:
   a planar dielectric plate connected to the outer circumference of the upper electrode to constitute an upper surface of the chamber together with the upper electrode; and a coil electrode mounted on an upper surface of the dielectric plate.

3. The apparatus according to claim 2, wherein the coil electrode has a planar helical shape surrounding the outer circumference of the upper electrode.

4. The apparatus according to claim 2, wherein the second plasma generating source further comprises a magnetic substance positioned to surround the coil electrode.

5. The apparatus according to claim 1, wherein the power supply comprises:
   a first RF power supply to provide an RF power to the first plasma generating source; and
   a second RF power supply to supply an RF power to the second plasma generating source.

6. The apparatus according to claim 5, wherein the RF power supplied to the first plasma generating source has a higher frequency than the RF power supplied to the second plasma generating source.

7. The apparatus according to claim 1, wherein the upper electrode comprises a plurality of apertures through which a reaction gas is introduced into the chamber.

8. The apparatus according to claim 1, wherein the chamber has a cylindrical shape, and has an inner pressure of 0.3.about.10 mTorr.

9. An apparatus to generate plasma, comprising a chamber having a plasma generating space defined therein, the apparatus further comprising:
   a lower electrode positioned within the chamber, and having a table to support a semiconductor substrate;
   an upper electrode facing the lower electrode and disposed within the chamber to constitute a first plasma generating source together with the lower electrode;
   a second plasma generating source positioned at a higher location than that of a lower surface of the upper electrode and disposed at an outer circumference of the upper electrode, the second plasma generating source comprising:
   a dome-shaped dielectric plate connected to the outer circumference of the upper electrode to constitute an upper surface of the chamber together with the upper electrode, and
   a coil electrode mounted on an upper surface of the dielectric plate; and
   a power supply to supply power to the first and second plasma generating sources.

10. The apparatus according to claim 9, wherein the coil electrode has a conical shape configured to surround the outer circumference of the upper electrode, and gradually decreases in height with respect to the lower surface of the upper electrode as a turning radius of the coil electrode increases.

11. The apparatus according to claim 10, wherein a distance between an outermost section of the coil electrode and the table disposed on the lower electrode is greater than a distance between the upper electrode and the table of the lower electrode.

12. The apparatus according to claim 9, wherein the second plasma generating source further comprises a magnetic substance positioned to concentrate a magnetic field generated by the coil electrode below the coil electrode.

13. The apparatus according to claim 9, wherein the power supply is provided separately for each of the first and second plasma generating sources to supply RF power thereto.

14. The apparatus according to claim 9, wherein the RF power supplied to the first plasma generating source has a higher frequency than the RF power supplied to the second plasma generating source.

15. The apparatus according to claim 9, wherein the upper electrode comprises a plurality of apertures through which a reaction gas is introduced into the chamber.

16. The apparatus according to claim 9, wherein the chamber has a cylindrical shape, and has an inner pressure of 0.3.about.10 mTorr.

17. An apparatus to generate plasma, the apparatus comprising:
   a first chamber comprising:
   a lower electrode positioned within the chamber and having a table to support a semiconductor substrate disposed thereon, and
   an upper electrode facing the lower electrode and disposed within the chamber to constitute a first plasma generating source together with the lower electrode;
   a second chamber having a predetermined height, and being positioned on an upper surface of the first chamber so as to surround an outer circumference of the upper electrode;
   an opening formed through the upper surface of the first chamber and a lower surface of the second chamber to communicate the first chamber with the second chamber;
   a second plasma generating source positioned on an upper surface of the second chamber; and
   a power supply to supply power to the first and second plasma generating sources.

18. The apparatus according to claim 17, wherein an inner and outer wall of the second chamber and the upper surface of the second chamber are formed from a dielectric material, and the second plasma generating source comprises a coil electrode mounted on the upper surface of the second chamber.

19. The apparatus according to claim 18, wherein the second plasma generating source further comprises a magnetic substance positioned to surround the coil electrode.

20. The apparatus according to claim 17, wherein a distance between the second plasma generating source and the table of the lower electrode is greater than a distance between the upper electrode and the table of the lower electrode.

21. The apparatus according to claim 17, wherein the second chamber is positioned such that an edge of the semiconductor substrate mounted on the table disposed on the lower electrode faces the opening of the second chamber.

22. The apparatus according to claim 17, wherein the second chamber further comprises a rare gas supply unit to supply a rare gas thereinto.

23. The apparatus according to claim 17, wherein the power supplied to the first plasma generating source has a higher frequency than the power supplied to the second plasma generating source.

24. The apparatus according to claim 17, wherein the upper electrode comprises a plurality of apertures through which a reaction gas is introduced into the chamber.

25. The apparatus according to claim 17, wherein the chamber has a cylindrical shape, and has an inner pressure of 0.3.about.10 mTorr.

26. A method of generating plasma, comprising:
   primarily generating plasma through a first plasma generating source positioned at a higher location than that of a second plasma generating source, and disposed at an outer circumference of the second plasma generating source; and
   secondarily generating plasma through the second plasma generating source once a predetermined period of time has elapsed after the plasma is primarily generated.

27. The method according to claim 26, wherein:
the first plasma generating source comprises an inductively coupled plasma generating source;
the second plasma generating source comprises a capacitively coupled plasma generating source; and
a plasma generating region has an inner pressure of 0.3.about.10 mTorr.

28. The method according to claim 26, wherein a plasma density is controlled by adjusting an intensity of an RF power supplied to the second plasma generating source.

29. A plasma generating apparatus, comprising:
a first chamber defining a reaction space therein;
a first plasma generating source comprising a lower and an upper electrode disposed within the first chamber and position to face each other and defining a first plasma generation region therebetween;
a second plasma generating source comprising a coil electrode and disposed at an outer circumference of the upper electrode and defining a second plasma generating region at a predetermined distance from the first plasma generation region; and
a plurality of power sources to supply an RF power to the first and second plasma generating sources,
wherein electrons of the plasma generated in the second plasma generating region diffuse the predetermined distance to the reaction space having a lower electron temperature.

30. The plasma generating apparatus of claim 29, wherein the second plasma generating source comprises:
a second chamber defining the second plasma generation region disposed at an upper surface of the first chamber, wherein the coil electrode is disposed at an upper surface thereof; and
an opening to communicate the first chamber and the second chamber to diffuse plasma generated in the second plasma generation region to the first generation region.

31. A plasma generating apparatus, comprising:
a chamber including first and second electrodes facing each other and disposed therein to generate a plasma from a gas dispersed therein by supplying a first RF power, the first electrode being disposed above the second electrode; and
an outer plasma generating source disposed on an outer surface of the chamber to surround an outer circumference of the first electrode and positioned above a lower surface of the first electrode to generate a plasma by supplying a second RF power having a lower frequency than the first RF power supplied.

32. The apparatus according to claim 31, wherein the outer plasma generating source comprises a coil electrode.

33. The apparatus according to claim 32, wherein the outer plasma generating source further comprises:
a dielectric plate to contain the coil electrode thereon.

34. The apparatus according to claim 33, wherein the outer plasma generating source further comprises:
a magnetic substance to surround upper and side surfaces of the coil electrode and having a high permeability.

35. The apparatus according to claim 33, wherein the dielectric plate is formed in the shape of a dome.

36. The apparatus of claim 31, further comprising:
a second chamber surrounding an outer circumference of the first chamber and having the outer plasma generating source disposed thereon to generate a plasma within the second chamber.

* * * * *